United States Patent
Yoshida

(10) Patent No.: US 6,704,338 B2
(45) Date of Patent: Mar. 9, 2004

(54) SEMICONDUCTOR LASER DEVICE, SEMICONDUCTOR LASER MODULE, AND SEMICONDUCTOR LASER CONTROL METHOD

(75) Inventor: Junji Yoshida, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 10/115,029

(22) Filed: Apr. 4, 2002

(65) Prior Publication Data

US 2003/0063646 A1 Apr. 3, 2003

(30) Foreign Application Priority Data

Sep. 28, 2001 (JP) ........................... 2001-300568

(51) Int. Cl.$^7$ .................................................. H01S 5/00
(52) U.S. Cl. ...................................................... 372/50
(58) Field of Search ...................... 372/50, 31; 359/124; 385/2, 88, 45

(56) References Cited

U.S. PATENT DOCUMENTS

| | | | |
|---|---|---|---|
| 5,349,598 A | * | 9/1994 | Ouchi et al. ............ 372/50 |
| 5,936,985 A | * | 8/1999 | Yamamoto et al. ........ 372/31 |
| 6,104,739 A | * | 8/2000 | Hong et al. ............. 372/50 |
| 6,166,837 A | * | 12/2000 | Adams et al. ........... 359/124 |
| 6,343,163 B1 | * | 1/2002 | Kawanishi ............... 385/2 |
| 6,384,963 B2 | | 5/2002 | Ackerman et al. |
| 6,394,665 B1 | * | 5/2002 | Hayashi ................. 385/88 |

\* cited by examiner

*Primary Examiner*—Paul Ip
*Assistant Examiner*—Tuan Nguyen
(74) *Attorney, Agent, or Firm*—Oblon, Spivak, McClelland, Maier & Neustadt, P.C.

(57) ABSTRACT

There is provided a semiconductor laser device in which a light amplifier integrated excitation light source is obtained by forming on a n-InP substrate a semiconductor laser diode section that outputs laser light having a plurality of oscillation vertical modes that are below the threshold value at which stimulated Brillouin scattering is generated together with a light amplifier section that amplifies laser light generated in the semiconductor laser diode section and outputs it to the outside. As a result, wavelength stability is increased and the generation of kinks is prevented.

10 Claims, 6 Drawing Sheets

SEMICONDUCTOR LASER DIODE SECTION

LIGHT AMPLIFIER SECTION

SEMICONDUCTOR LASER DIODE SECTION | LIGHT AMPLIFIER SECTION

SEMICONDUCTOR LASER DIODE SECTION | LIGHT ATTENUATOR SECTION

SEMICONDUCTOR LASER DEVICE, SEMICONDUCTOR LASER MODULE, AND SEMICONDUCTOR LASER CONTROL METHOD

FIELD OF THE INVENTION

The present invention relates to a semiconductor laser device provided with a semiconductor laser diode which outputs laser light having a plurality of oscillation vertical modes, a semiconductor laser module, and a semiconductor laser control method.

BACKGROUND OF THE INVENTION

In recent years, as a result of the rapid rise in popularity of the Internet and the rapid increase in internal LAN connections inside businesses and the like, there have been problems not only with the increase in the number of communication calls, but also with the increase in data traffic that has accompanied the increasing volume of data contents being transferred. Therefore, in order to prevent a drop in communication performance caused by these problems, wavelength division multiplexing (WDM) systems have undergone remarkable development and are in widespread use.

In a WDM system, by placing a plurality of optical signals on respectively different wavelengths, a hundred-fold increase over the conventional volume of data transfer has been achieved using a single optical fiber. In particular, by performing light amplification using erbium doped fiber amplifiers (EDFA) and Raman amplifiers, existing WDM systems become capable of long distance broadband transmissions. Here, an EDFA is a concentrated type of optical fiber amplifier that employs the principle of the light of a transmission signal in the 1550 nm wavelength band being amplified inside a special optical fiber that is doped with the element erbium and has excitation laser light having a 1480 nm wavelength or a 980 nm wavelength passed therethrough. A Raman amplifier, on the other hand, is a distribution type optical fiber amplifier that uses stimulated Raman scattering and that acts as an amplifying medium to enable an existing optical fiber to amplify signal light in its existing state.

Accordingly, in a WDM system, it is essential to achieve highly accurate oscillation control as well as high output operation for both a light source for a signal that creates a light signal itself, and also for an excitation light source used in the above described optical fiber amplifiers. In particular, it is desirable that the light source for a signal and the excitation light source can be obtained using a semiconductor laser diode, and that the signal modulation and amplification degree can be controlled electrically.

In a semiconductor laser diode used as a signal light source, in order to make the faster transmission of a greater volume of information possible, a direct modulation method in which an injection current applied to the semiconductor laser diode is modulated by a signal is often used. However, in this method, the problem of what is known as "wavelength chirping" exists. Wavelength chirping has a cycle of, variation in the carrier density in the active layer caused by changes in the injection current→variation in the refractive index→variation in the oscillation wavelength. Therefore, currently, what are known as "modulator integrated light sources", in which a semiconductor laser diode and a semiconductor light modulator are integrated on the same substrate, are being developed. In a modulator integrated light source, in order for modulation to be performed by a semiconductor light modulator section, no variation in the injection current in the semiconductor laser diode section is generated, and thus the above described problem of wavelength chirping is avoided.

SUMMARY OF THE INVENTION

It is an object of the present invention to provide a semiconductor laser device in which the injection current of the semiconductor laser diode is fixed, a semiconductor laser module, and a semiconductor laser control method by providing a semiconductor laser diode that outputs laser light having a plurality of oscillation vertical modes, and by integrating a light amplifier and a light attenuator on the same substrate as the semiconductor laser diode.

According to one aspect of the present invention, a semiconductor laser device, comprising, a semiconductor laser diode section that generates laser light having a plurality of oscillation vertical modes that are below a predetermined output value using wavelength selection properties of a diffraction grating formed adjacent to an active layer and between a reflective end surface and an emission end surface of laser light, and a semiconductor light adjustment section that is integrated on the same semiconductor substrate on which the semiconductor laser diode section is formed, and that adjusts an output of the laser light.

According to this aspect, it is possible for a semiconductor laser diode section to generate laser light having a plurality of oscillation vertical modes whose peaks are below a predetermined output value such as the threshold value at which stimulated Brillouin scattering is generated, and for the output power of this laser light to be adjusted by a semiconductor light adjustment section that is integrated on the same substrate as that of the semiconductor laser diode section.

According to another aspect of the present invention, a semiconductor laser module, comprising, the above described semiconductor laser device, an optical fiber which guides laser light emitted from the semiconductor laser device to the outside, and an optical coupling lens system which optically couples the semiconductor laser device with the optical fiber.

According to this aspect, the above described semiconductor laser device can be provided sealed in a package casing.

According to still another aspect of present invention, a semiconductor laser control method that controls an output of laser light from the above described semiconductor laser device, comprising, a step of fixing a current applied to the semiconductor laser diode section, and a step of adjusting a current or voltage applied to the semiconductor light adjustment section.

According to this aspect, it is possible to adjust and then output the output power of the laser light to be finally output while varying the injection current of the semiconductor laser diode section.

Other objects and features of this invention will become understood from the following description with reference to the accompanying drawings.

DETAILED DESCRIPTIONS

In a semiconductor laser device of the conventional art that is used as an excitation light source in which a diffraction grating is contained within a laser resonator and that performs vertical multimode oscillation within a narrow spectrum, although there is no variation in the injection current due to modulation, because the injection current is large, the problem exists of what are known as "kinks", which are bends in the characteristic curve of the current-light output characteristics that are caused by vertical mode hops, being generated.

Moreover, in an ultra long distance WDM system in which the number of relay stages exceeds 100, regardless of whether an EDFA, a Raman amplifier, or both are employed, even if the gain deviation in these amplifiers is minute, the deviation accumulates as the number of relay stages increases, resulting in the problem of the gain bandwidth becoming narrower. In order to solve this problem, the excitation light source of each amplifier, namely, the output power of the semiconductor laser diode is controlled. For example, when the excitation light source is constructed using semiconductor laser diodes having a plurality of different wavelengths, as is the case with a Raman amplifier, in order to flatten out the gain of the amplifier, it is necessary to control the output power for the semiconductor laser diodes corresponding to each wavelength.

However, the control of the output power, namely, the increase or decrease of the injection current causes variations in the oscillation wavelength, as is described above, and the problem arises that the above described gain deviations are not completely removed.

In order to solve the above problems, the preferred embodiments of the semiconductor laser device, the semiconductor laser module, and the semiconductor laser control method of the present invention will now be described in detail based on the drawings. It is to be understood that the present invention is not limited by these embodiments.

(First Embodiment)

Firstly, the semiconductor laser device and semiconductor laser control method according to a first embodiment will be described. In the semiconductor laser device according to the first embodiment, by integrating a semiconductor laser diode section and a light amplifier section on the same semiconductor substrate, the output power is controlled by the light amplifier section and the injection current of the semiconductor laser diode section is fixed. Note that, here, a semiconductor optical amplifier (SOA) is given as an example of a light amplifier section.

Figure 1:
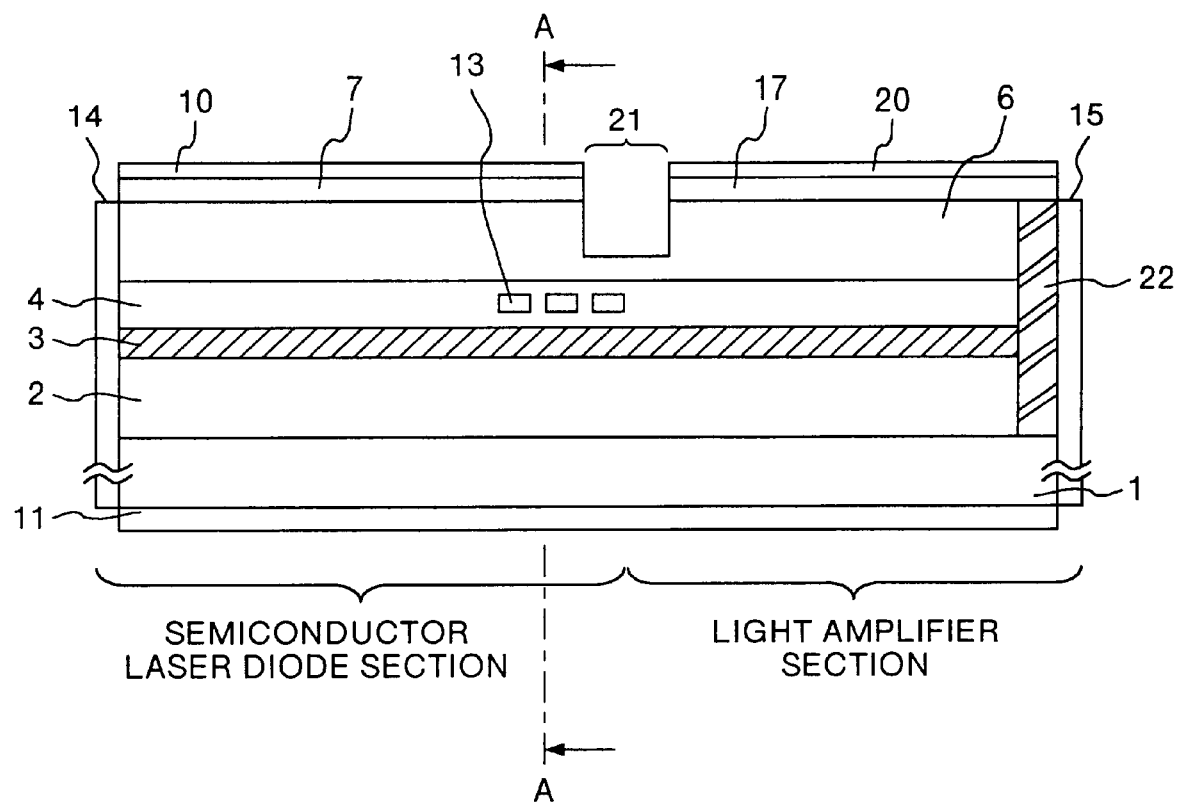
FIG. 1 is a vertical cross sectional view in the longitudinal direction of the semiconductor laser device according to a first embodiment of the present invention.
Figure 2:
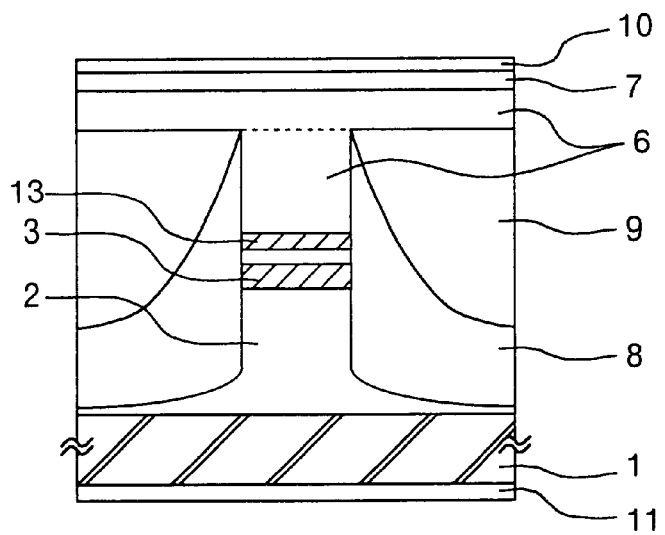
FIG. 2 is a cross-sectional view along the line A—A of the semiconductor laser diode shown in FIG. 1.

FIG. 1 is a vertical cross sectional view in the longitudinal direction of the semiconductor laser device according to the first embodiment. FIG. 2 is a cross-sectional view along the line A—A of the semiconductor laser device shown in FIG. 1. As is shown in FIG. 1, the semiconductor laser device according to the first embodiment has a structure in which an n-InP buffer layer 2 that doubles as a lower cladding layer and a buffer layer based on n-InP, a graded index-separate confinement hetero structure multi quantum well (GRIN-SCH-MQW) active layer 3 having compression distortion, a p-InP spacer layer 4, and a p-InP cladding layer 6 are superposed in that order on a (100) surface of an n-InP substrate 1.

After a separation groove 21 has been formed as is shown in the drawings by superposing a p-InGaAsP cap layer and a p side electrode in that sequence on the p-InP cladding layer 6, the group formed by the p-InGaAsP cap layer 7 and p side electrode 10 is disposed so as to be substantially insulated electrically from the group formed by the p-InGaAsP cap layer 17 and p side electrode 20. In addition, an n side electrode 11 is provided on the bottom surface of the n-InP substrate 1.

As is shown in FIG. 1, a reflective membrane 14 having a high light reflectance of 80% or more is formed at a light reflective end surface that is one end surface in the longitudinal direction of the semiconductor laser device. An emission side reflective membrane 15 having a low light reflectance of 2% or less, preferably 1% or less is formed at a light emitting end surface that is the other end in the longitudinal direction of the semiconductor laser device. Light generated inside the GRIN-SCH-MQW active layer 3 of the optical resonator formed by the reflective membrane 14 and the emission side reflective membrane 15 is reflected by the reflective membrane 14 and is emitted as laser light via the emission side reflective membrane 15. Note that, as is shown in the drawings, the GRIN-SCH-MQW active layer 3 is recessed towards the center from the crystal end surface to form what is known as a "window area" 22. As a result of this combined with the emission side reflective membrane 15, an effective low reflectance is achieved and the effects of light reflected by the reflective membrane 14 are reduced.

The semiconductor laser device shown in FIG. 1 has a p-InGaAsP diffraction grating 13 positioned cyclically within the p-InP spacer layer 4. In particular, here, the diffraction grating 13 is formed with a membrane thickness of 20 nm extending for a length of approximately 100 $\mu$m from substantially the center surface of the separation groove 21 and at a pitch of approximately 220 nm in order for light having a central wavelength of 1.48 $\mu$m to be selected from the laser light generated in the gain area of the GRIN-SCH-MQW active layer 3. It is desirable that the diffraction grating 13 is placed starting from a position in contact with the substantially central surface of the separation groove 21, however, even if it is not placed in contact therewith, provided that it is within a range that enables the functions of the diffraction 13 to be performed, it may be placed at a position away from the center surface, for example, within a range of 20 μm to 100 μm therefrom.

As is shown in FIG. 2, the top portion of the n-InP buffer layer 2, the GRIN-SCH-MQW active layer 3, and the p-InP spacer layer 4 that contains the diffraction grating 13 are formed in a mesa stripe configuration and both sides of the mesa stripes are covered by an n-InP blocking layer 9 and a p-InP blocking layer 8 formed as current blocking layers.

In particular, in this semiconductor laser device, with the separation groove 21 functioning as a boundary, the reflective membrane 14 functions as a semiconductor laser diode and the emission side reflective membrane 15 functions as a light amplifier. In other words, laser light generated in the semiconductor laser diode section is continuously irradiated into the light amplifying section inside the GRIN-SCH-MQW active layer 3 located below the separation groove 21. It is then amplified in the light amplifier section. Ultimately, laser light that has been amplified in the light amplifier section is output to the outside via the emission side reflective membrane 15.

The characteristics of the semiconductor laser diode section will now be described. When the above described semiconductor laser device is used as an excitation light source in a Raman amplifier, the oscillation wavelength $\lambda_0$ thereof is 1100 nm to 1500 nm and the resonator length L determined over the interval between the reflective membrane 14 and the emission side reflective membrane 15 is 800 μm or more and 3200 μm or less. Note that, generally, the mode interval $\Delta\lambda$ of the vertical modes generated by the resonator of the semiconductor laser diode can be defined by the following formula if the equivalent refractive index is taken as n. Namely, $$\Delta\lambda = \lambda_0^2/(2 \cdot n \cdot L).$$

Here, if the oscillation wavelength $\lambda_0$ is taken as 1480 nm and the effective refractive index is taken as 3.5, then when the oscillator length L is 800 μm, the mode interval $\Delta\lambda$ of the vertical modes is approximately 0.39 nm, and when the oscillator length L is 3200 μm, the mode interval $\Delta\lambda$ of the vertical modes is approximately 0.1 nm. Namely, the longer the resonator length L, the narrower the mode interval $\Delta\lambda$ of the vertical mode and there is less leeway in the selection conditions of oscillating laser light in a single vertical mode.

Figure 3:
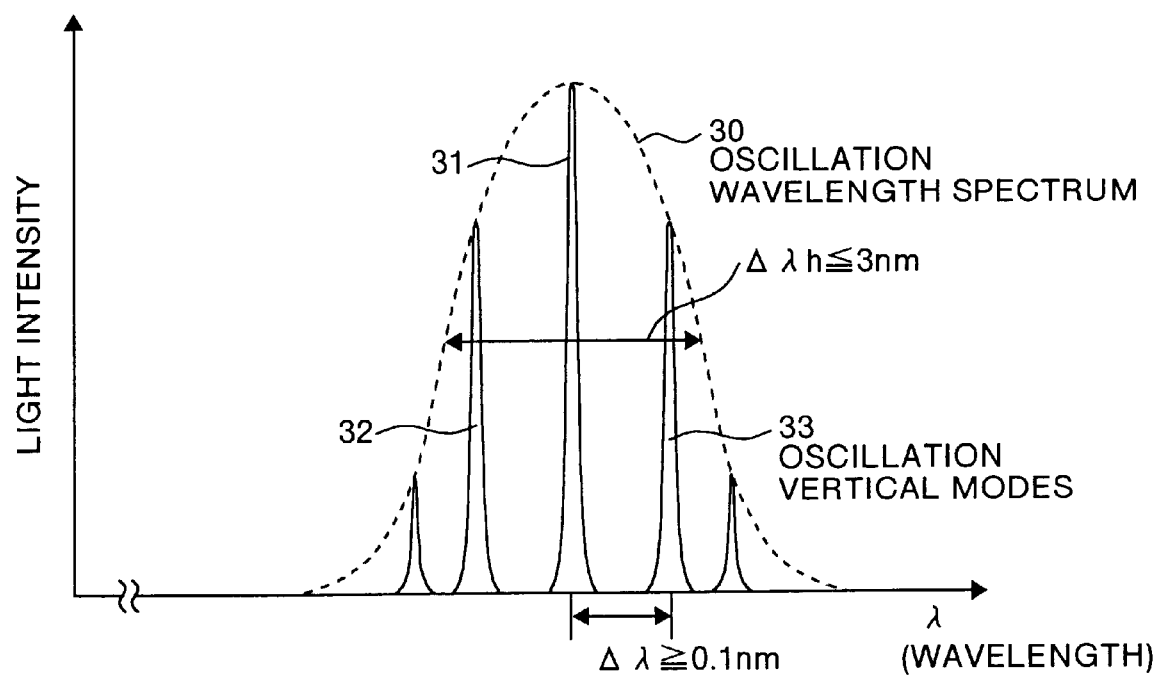
FIG. 3 is a view which shows a graph which explains the wavelength selection properties of the diffraction grating of the semiconductor laser device according to the first embodiment.

In contrast, the diffraction grating 13 selects the vertical mode using the Bragg wavelength thereof. FIG. 3 is a graph which explains the wavelength selection properties of the diffraction grating 13. The selection wavelength properties of the diffraction grating 13 are represented as the oscillation wavelength spectrum 30 shown in FIG. 3.

In particular, as is shown in FIG. 3, the semiconductor laser device is designed such that a plurality of oscillation vertical modes are created in the wavelength selection characteristics shown by the half breadth $\Delta\lambda h$ of the oscillation wavelength spectrum 30 due to the existence of the diffraction grating 13. In a conventional semiconductor laser diode, because single vertical mode oscillation becomes difficult if the resonator length L is 800 μm or more, semiconductor laser devices having this resonator length L have not been used. However, in this semiconductor laser device, by positively setting the resonator length L to be 800 μm or more, laser light is output with a plurality of oscillation vertical modes contained in the half breadth $\Delta\lambda h$ of the oscillation wavelength spectrum. In FIG. 3, three oscillation vertical modes 31 to 33 are contained in the half breadth $\Delta\lambda h$ of the oscillation wavelength spectrum.

Figure 4A:
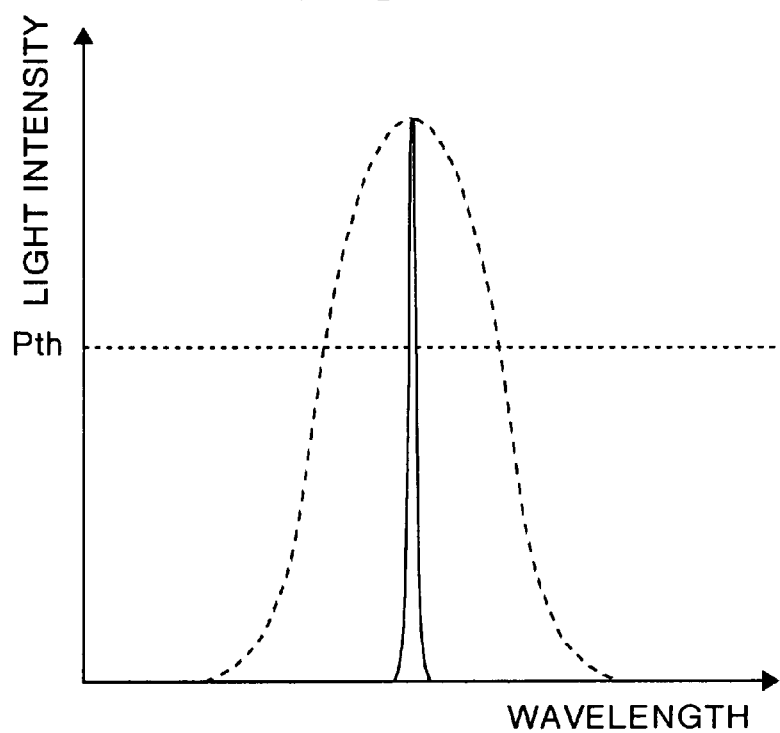
FIG. 4 is a view which explains the respective profiles of the laser light of a single oscillation mode and the laser light of a plurality of oscillation vertical modes in the semiconductor laser device according to the first embodiment.
Figure 4B:
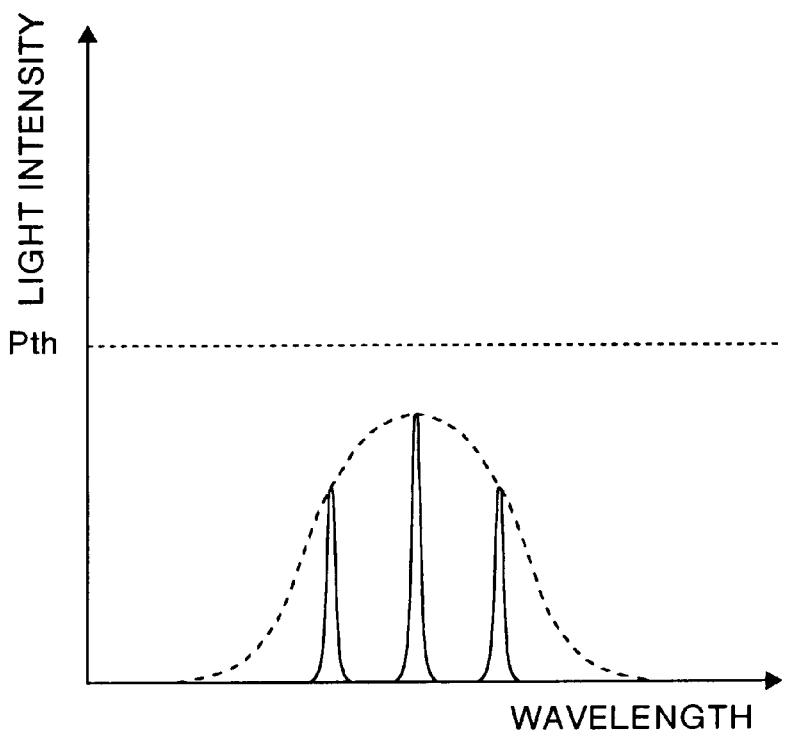

If laser light having a plurality of oscillation vertical modes is used, then compared with when laser light having a single vertical mode is used, the peak value of the laser output is suppressed and a high laser output value is obtained. FIG. 4 is an explanatory view which explains the respective profiles of the laser light of a single oscillation mode and the laser light of a plurality of oscillation vertical modes. For example, in the above described semiconductor laser diode section, a high laser output having a low peak value and having the profile shown in FIG. 4(b) can be obtained. In contrast to this, FIG. 4(a) shows the profile of a semiconductor laser device having a single vertical mode oscillation when the same laser output is obtained having a high peak value.

Here, when the semiconductor laser device of the first embodiment is used as an excitation light source in a Raman amplifier, it is desirable that the excitation light output power be increased in order to increase the Raman gain. However, the problem arises that the higher the peak value, the more stimulated Brillouin scattering is generated and the more noise occurs. As is shown in FIG. 4(a), stimulated Brillouin scattering is generated when a laser output exceeds a threshold value $P_{th}$ at which stimulated Brillouin scattering is generated. Therefore, in order to obtain laser output power having the same profile as that shown in FIG. 4(a) in the present semiconductor laser device, as is shown in FIG. 4(b), laser light is irradiated in a plurality of oscillation vertical modes whose peak values are kept below the stimulated Brillouin scattering threshold value $P_{th}$. As a result, it is possible to obtain a high excitation light output power, which, in turn, enables a high Raman gain to be obtained.

Note that, in FIG. 3, the wavelength interval (mode interval) $\Delta\lambda$ of the oscillation vertical modes 31 to 33 is set to 0.1 nm or more. This is because, when the semiconductor laser device is used as an excitation light source for a Raman amplifier, if the mode interval $\Delta\lambda$ is less than 0.1 nm, there is a high likelihood of stimulated Brillouin scattering occurring. As a result, it is preferable if the aforementioned resonator length L is not more than 3200 μm according to the aforementioned mode interval $\Delta\lambda$ formula. From this standpoint, it is desirable that there is a plurality of oscillation vertical modes contained within the half breadth $\Delta\lambda$ h of the oscillation wavelength spectrum 30.

Accordingly, as described above, because the position where the diffraction grating 13 is located and the resonator length L in the semiconductor laser device according to the first embodiment are set such that two or more oscillation vertical modes are contained within a half breadth of the oscillation wavelength spectrum, there is no generation of stimulated Brillouin scattering and a stable, high output of laser light is obtained.

Figure 5:
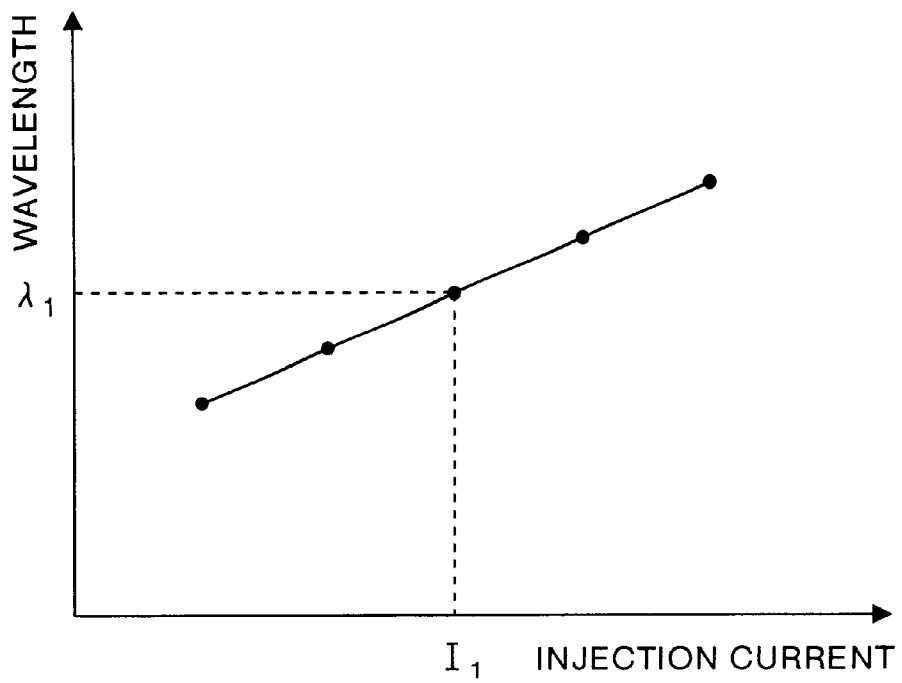
FIG. 5 is a view which shows the relationship between the oscillation wavelength and the injection current of the semiconductor laser diode section in the semiconductor laser device according to the first embodiment.

In FIG. 1, the output power of the laser light generated by the semiconductor laser diode section increases in proportion to the current applied between the p side electrode 10 and the n side electrode 11, namely, in proportion to the injection current injected into the GRIN-SCH-MQW active layer 3. However, the variations in the injection current cause variations in the oscillation wavelength due to changes in the refractive index of the diffraction grating. FIG. 5 is a view which shows the relationship between the oscillation wavelength and the injection current of the semiconductor laser diode section.

As is shown in FIG. 5, as the injection current increases the oscillation wavelength shifts to the long wavelength side. In other words, in a Raman amplifier that changes an injection current and then uses this current, the gain spectrum is varied together with the injection current, which is not desirable when the accurate propagation of light is to be performed. Therefore, in the semiconductor laser device according to the first embodiment, as is shown in FIG. 5, by fixing the injection current applied to the semiconductor laser diode section (injection current $I_1$), the oscillation wavelength of the generated laser light is also fixed (wavelength $\lambda_1$).

However, if the injection current of the semiconductor laser diode section is fixed, then it is not possible to change the output power. Therefore, the injection current of the semiconductor laser diode section is set to a low level in advance so that the output power of the laser light thereby generated is also low. By amplifying the low output laser light in the light amplifier section, the output power of the laser light that is ultimately output from the semiconductor laser device is controlled.

Figure 6:
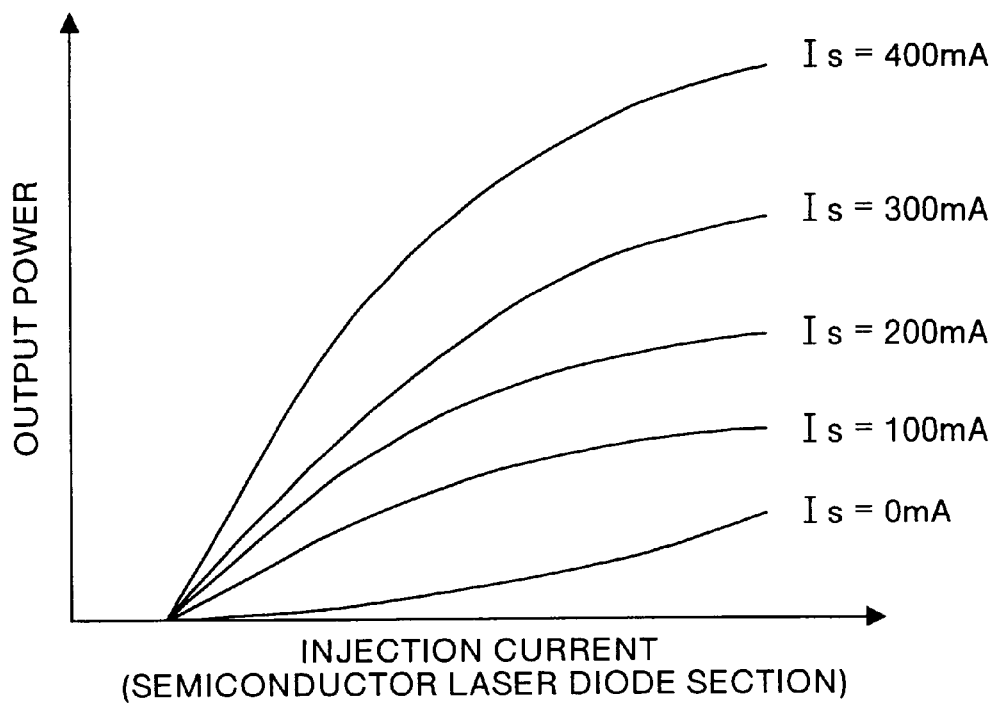
FIG. 6 is a view which shows the relationship between the output power and the injection current of the semiconductor laser diode section for the respective drive currents of the optical amplifier section in the semiconductor laser device according to the first embodiment.

FIG. 6 is a view which shows the relationship between the output power and the injection current of the semiconductor laser diode section for the respective drive currents of the optical amplifier section. As is shown in FIG. 6, when the drive current $I_s$ of the light amplifier section is 0 mA, a relationship between the output power and the injection current that corresponds to the characteristics of the semiconductor laser diode section, as is described above, is shown. However, as the drive current $I_s$ of the light amplifier section increases, the output power of the laser light ultimately output from the emission side reflected membrane 15 increases.

Note that the drive current of the light amplifier section corresponds to the applied current that is applied between the p side electrode 20 and the n side electrode 11. The carrier generated by this applied current has the same stimulated amplification effect as laser oscillation on the laser light passing through the GRIN-SCH-MQW active layer 3.

Accordingly, in the semiconductor laser device according to the first embodiment, it is possible to obtain laser light having the desired output power due to the operation of the light amplifier section even when the injection current of the semiconductor laser diode section is fixed at a small value. The result of this is that stable wavelength operations can be achieved and the generation of kinks caused by an increase in the injection current can be prevented.

In particular, in the structure of the semiconductor laser device shown in FIG. 1, numerous advantages are obtained. For example, there is a smooth connection between the semiconductor laser diode section and the light amplifier section and there is no generation of excess reflection light being reflected back, there is no excessive connection loss, and neither of the connecting portions is exposed to air before crystal growth so that defects in the connecting portions are reduced.

Figure 7:
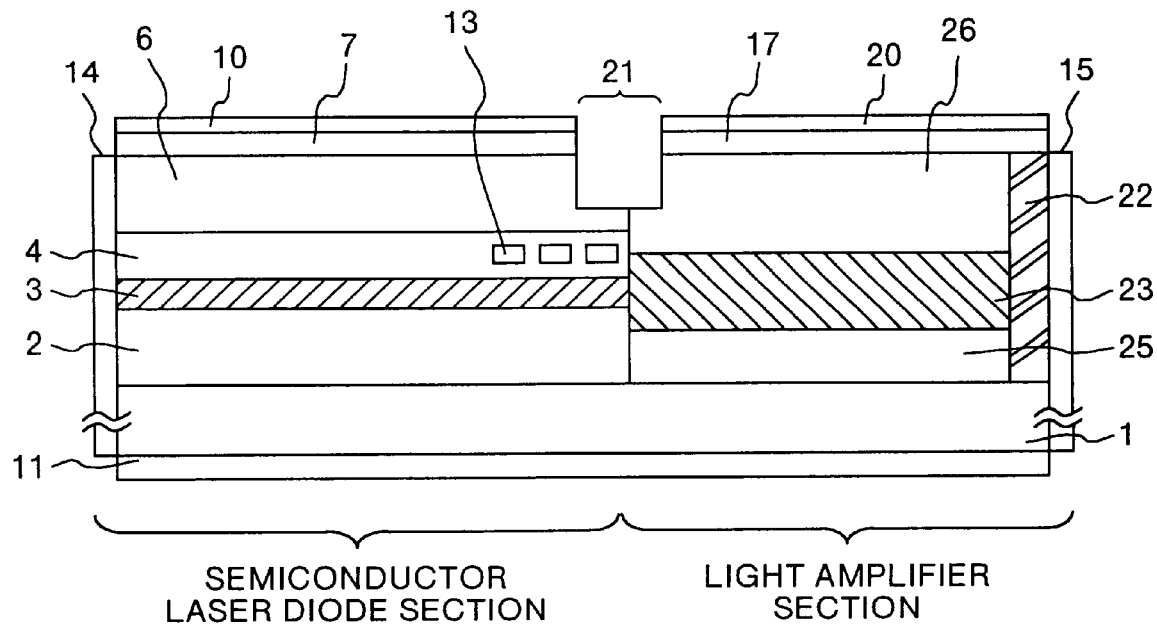
FIG. 7 is a vertical cross sectional view when the semiconductor laser device according to the first embodiment is formed using a butt joint.

It is also possible for the semiconductor laser diode section and the light amplifier section to be formed using different crystal growths in what is known as a "butt joint". FIG. 7 is a vertical cross sectional view when the semiconductor laser device according to the first embodiment is formed using a butt joint. Note that, those portions in FIG. 7 that are common to FIG. 1 are given the same symbols and a description thereof is omitted. The semiconductor laser device shown in FIG. 7 differs from that in FIG. 1 in that the light amplifier section is formed by superposing on an n-InP substrate 1 in the following sequence an n-InP buffer layer 25 that doubles as a lower cladding layer and a buffer layer based on n-InP, a GRIN-SCH-MQW active layer 23, and a p-InP cladding layer 26. It also differs in that the crystal growth thereof is performed using a different process from the n-InP buffer layer 2, GRIN-SCH-MQW active layer 3, p-InP spacer layer 4, and p-InP cladding layer 6 that form the semiconductor laser diode section.

In particular, the above described layered structure used to form the semiconductor laser diode section is formed with the optimum crystal growth parameters which form a semiconductor laser diode. Moreover, the above described layered structure used to form the light amplifier section is also formed with the optimum crystal growth parameters which form a light amplifier.

As has been described above, according to the semiconductor laser device and semiconductor laser control method of the first embodiment, a light amplifier integrated excitation light source is achieved by forming a semiconductor laser diode section that outputs laser light having a plurality of oscillation vertical modes that are below the threshold value at which stimulated Brillouin scattering is generated on the same semiconductor substrate as a light amplifier section that amplifies laser light generated in the semiconductor laser diode section and outputs it to the outside. As a result, even if the injection current of the semiconductor laser diode section is fixed at a small value, by controlling the drive current of the light amplifier section, it is possible to adjust the output power of emitted laser light. Namely, the output power of laser light can be adjusted, the problem of wavelength chirping is solved by fixing the injection current, and the generation of kinks is prevented due to the low injection current.

(Second Embodiment)

The semiconductor laser device and semiconductor laser control method according to a second embodiment will now be described. Instead of the light amplifier section of the semiconductor laser device according to the first embodiment, the semiconductor laser device according to the second embodiment is provided with a light attenuator section. Adjustment of the final output power is made possible by attenuating the output power of laser light generated in the semiconductor laser diode section to an optional size. Here, a light attenuator formed by a semiconductor is used as an example of a light attenuator section.

Figure 8:
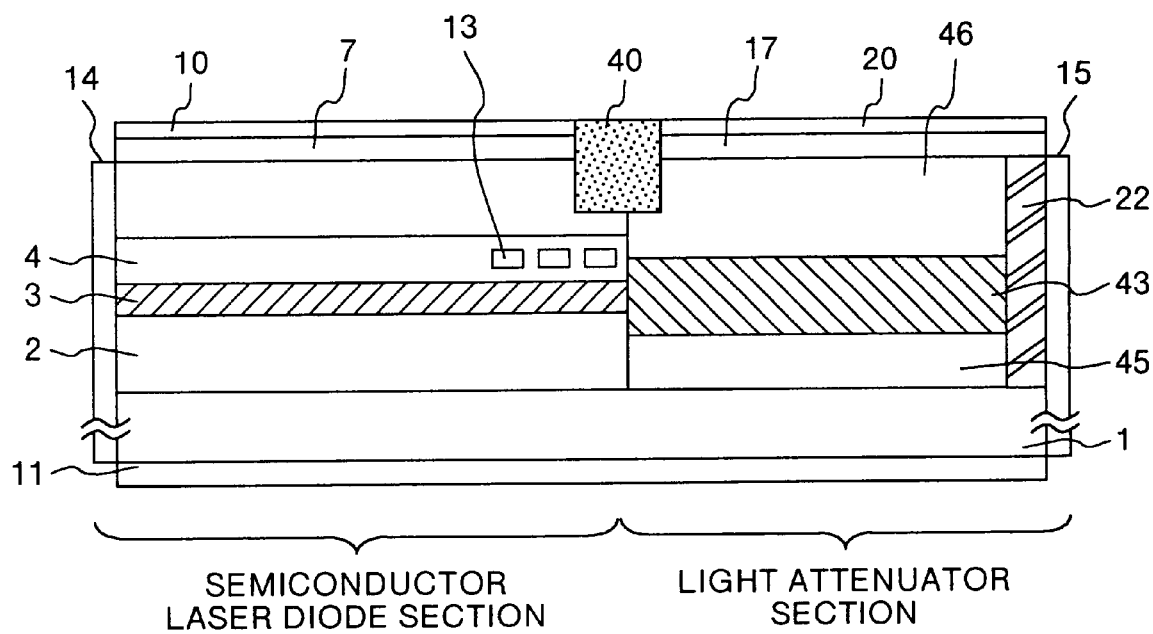
FIG. 8 is a vertical cross-sectional view in the longitudinal direction of the semiconductor laser device according to a second embodiment of the present invention.

FIG. 8 is a vertical cross-sectional view in the longitudinal direction of the semiconductor laser device according to the second embodiment. Note that, those portions in FIG. 8 that are common to FIG. 1 are given the same symbols and a description thereof is omitted. In particular, the semiconductor laser diode section shown in FIG. 8 outputs laser light having a plurality of oscillation vertical modes whose peaks are below the threshold value at which stimulated Brillouin scattering is generated, as was described in the first embodiment.

In FIG. 8, the light attenuator section is constructed by forming an n-InP buffer layer 45 that doubles as a lower cladding layer and a buffer layer based on n-InP, an active layer 43, and a p-InP cladding layer 46 are superposed on an n-InP substrate 1 that the light attenuator section shares with the semiconductor laser diode.

Here, as was described in the first embodiment, a p-InGaAsP cap layer 17 and a p side electrode 20 are superposed in that sequence on a p-InP cladding layer 46. An n side electrode 11 is formed on the rear surface of the n-InP substrate 1, however, the light attenuator section operates by reverse bias, in which a minus potential is applied to the p side electrode 20.

Therefore, although there is a concern that leakage current will be generated between the p side electrode 20 and the p side electrode 10 forming the semiconductor laser diode section, this is prevented by forming the semiconductor laser diode section and the light attenuator section using the butt joint, as described above, and by providing an Fe or proton doped high resistance layer on a cutoff area 40 that corresponds to the separation groove 21 shown in FIG. 1.

It is also necessary to form an absorption layer 43 from semiconductor mixed crystal having the appropriate composition ratio, such that the absorption layer 43 has a band gap which efficiently absorbs laser light generated in the semiconductor laser diode section.

In the semiconductor laser device according to the second embodiment because it is necessary to adjust the output power by attenuation, the injection current of the semiconductor laser diode section needs to be fixed at a high value.

As has been described above, according to the semiconductor laser device and semiconductor laser control method of the second embodiment, a light attenuator integrated excitation light source is achieved by forming a semiconductor laser diode section that outputs laser light having a plurality of oscillation vertical modes that are below the threshold value at which stimulated Brillouin scattering is generated on the same semiconductor substrate as a light attenuator section that attenuates laser light generated by the semiconductor laser diode section and outputs it to the outside. As a result, even if the injection current of the semiconductor laser diode section is fixed, by controlling the drive current of the light attenuator section, it is possible to adjust the output power of emitted laser light. Namely, the output power of laser light can be adjusted and stable wavelength operation can be achieved by fixing the injection current.

(Third Embodiment)

The semiconductor laser module according to a third embodiment will now be described. The semiconductor laser module according to the third embodiment is formed by sealing the semiconductor laser device according to the above first or second embodiments in a package together with various optical components. The semiconductor laser device according to the above first or second embodiments is modularized in order to simplify the irradiation of laser light generated by the semiconductor laser device into an optical fiber.

Figure 9:
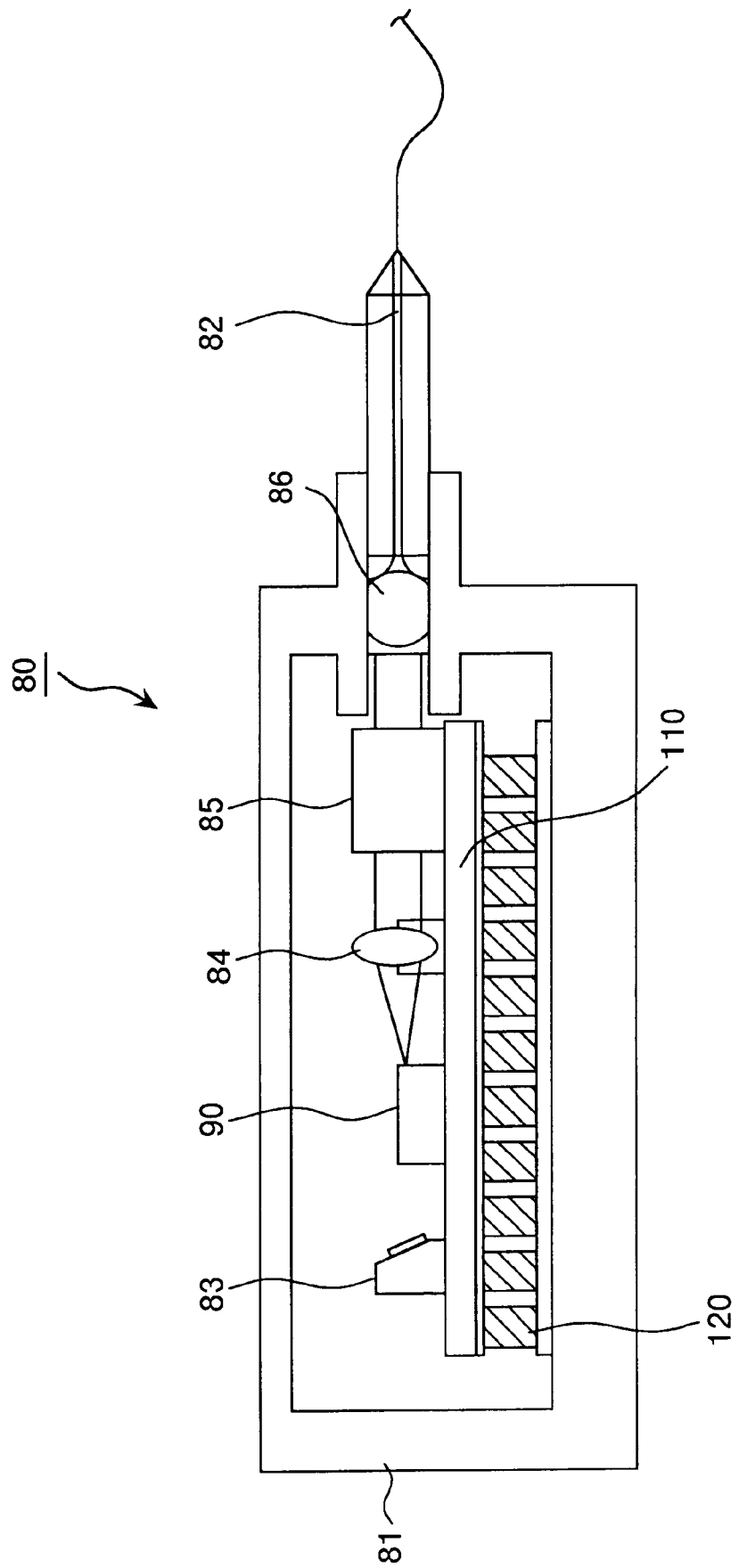
FIG. 9 is a vertical cross-sectional view which shows the structure of the semiconductor laser module according to a third embodiment of the present invention.

FIG. 9 is a vertical cross-sectional view which shows the structure of the semiconductor laser module according to the third embodiment. In FIG. 9, the semiconductor laser module 80 is provided with a Peltier element 120 on the internal bottom surface of a package 81 formed from ceramic or the like. A base 110 is provided above the Peltier element 120 and a semiconductor laser device 90 is provided on the base 110. Here, the semiconductor laser device 90 corresponds to the semiconductor laser device shown in the first or second embodiments.

In the structure formed by the Peltier element 120, the base 110, and the semiconductor laser device 90, a current (not shown) is applied to the Peltier element 120 and either cooling or heating is performed depending on the polarity thereof. However, the Peltier element 120 is mainly used as a cooling device in order to prevent oscillation wavelength shifting due to a rise in the temperature of the semiconductor laser device 90. Namely, when the wavelength of the laser light is longer than the desired wavelength, the Peltier element 120 acts as a cooling device to maintain a low temperature. When the wavelength of the laser light is shorter than the desired wavelength, the Peltier element 120 acts as a heating device to maintain a high temperature. This temperature control is performed, based on values detected by a thermistor (not shown) disposed in the vicinity of the semiconductor laser device 90, by a control device (not shown) that controls the Peltier element 120 such that the temperature of the semiconductor laser device 90 is always kept constant. Moreover, a control device (not shown) controls the Peltier element 120 such that the temperature of the semiconductor laser device 90 is lowered as the drive current of the semiconductor laser device 90 is raised. Performing this type of temperature control makes it possible to improve the wavelength stability of the semiconductor laser device 90 and is effective in obtaining an improvement in the yield.

In FIG. 9, in addition to the semiconductor laser device 90, a light monitor 83, a first lens 84, and an isolator 85 are provided on the base 110. In the semiconductor module 80, a second lens 86 is provided in the semiconductor laser module 80 inside the portion where the optical fiber is connected.

Laser light output from the semiconductor laser device 90 is guided into an optical fiber 82 via the first lens 84, an isolator 85, and the second lens 86. The second lens 86 is provided on the package 81 on the optical axis of the laser light and is optically coupled to the externally connected optical fiber 82. The light monitor 83 detects and monitors leakage light leaking from the reflective membrane side of the semiconductor laser device 90.

As a result of the isolator 85 being interposed between the semiconductor laser device 90 and the optical fiber 82, returning light reflected by other optical parts and the like can be prevented from returning inside the resonator and as stray light having an adverse effect on the oscillation operation and the detection operation.

As has been described above, according to the semiconductor laser module of the third embodiment, because the semiconductor laser device of the first or second embodiments has been modularized, it is possible to reduce returning light using a polarization independent type of isolator and hasten a reduction in noise and in the number of parts.

In the above described third embodiment, an example is given of when an isolator 85 is provided, however, it is to be understood that it is not essential that an isolator be provided.

In the above described first to third embodiments, an example is given of when the oscillation wavelength $\lambda_0$ of the semiconductor laser device is set to 1480 nm, however, it is to be understood that the present invention can also be applied when a semiconductor laser diode section having another oscillation wavelength, such as 980 nm, is used. Furthermore, it is to be understood that the present invention may also be applied to an EDFA in addition to a Raman amplifier.

As has been described above, in the semiconductor laser device and semiconductor laser control method according to the present invention, a light amplifier integrated excitation light source is achieved by forming a semiconductor laser diode section that outputs laser light having a plurality of oscillation vertical modes that are below the threshold value at which stimulated Brillouin scattering is generated on the same semiconductor substrate as a light amplifier section that amplifies laser light generated in the semiconductor laser diode section and outputs it to the outside. As a result, the effects are achieved that, even if the injection current of the semiconductor laser diode section is fixed at a small value, by controlling the drive current of the light amplifier section, it is possible to adjust the output power of emitted laser light and adjust the output power of laser light and, by fixing the injection current, stable wavelength operation is achieved and the generation of kinks caused by the injection current can be prevented.

Moreover, in the semiconductor laser device and semiconductor laser control method according to the present invention, a light attenuator integrated excitation light source is achieved by forming a semiconductor laser diode section that outputs laser light having a plurality of oscillation vertical modes that are below the threshold value at which stimulated Brillouin scattering is generated on the same semiconductor substrate as a light attenuator section that attenuates laser light generated by the semiconductor laser diode section and outputs it to the outside. As a result, the affects are achieved that, even if the injection current of the semiconductor laser diode section is fixed, by controlling the drive current of the light attenuator section, it is possible to adjust the output power of emitted laser light and adjust the output power of laser light and, by fixing the injection current, stable wavelength operation can be achieved.

Further, in the semiconductor laser module according to the present invention, the effect is achieved that the above described semiconductor laser devices can be provided sealed in a package casing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device, comprising:
   a semiconductor substrate;
   a semiconductor laser diode section disposed on a first portion of said semiconductor substrate, said semiconductor laser diode section having
      a reflective end surface,
      an emission end surface, and
      an active layer configured to produce laser light that propagates between said reflective end surface and said emission end surface;
   a diffraction grating formed adjacent to said active layer and between said reflective end surface and said emission said surface, wherein said diffraction grating and said active layer cooperate to produce said laser light formed configured to have a plurality of oscillation vertical modes that are below a predetermined output value, consistent with wavelength selection properties of the diffraction grating; and
   a semiconductor light adjustment section that is integrated on a second portion of the semiconductor substrate and configured to adjusts an output of the laser light.

2. The semiconductor laser device according to claim 1, wherein at least one electrode of an electrode pair that apply a current to said semiconductor laser diode section and at least one electrode of an electrode pair that apply a current to said semiconductor light adjusting section are electrically separated by a separation groove formed at a boundary of a joint between said semiconductor laser diode section and said semiconductor light adjustment section.

3. The semiconductor laser device according to claim 1, wherein said semiconductor light adjustment section has a layered structure formed by a waveguide path having a different composition from at least an active layer of said semiconductor laser diode element section.

4. The semiconductor laser device according to claim 1, wherein a reflective end surface of the laser light forms an end surface of the semiconductor laser diode section and a high reflective membrane is provided on the end surface, and an emission end surface of the laser light forms an end surface of said semiconductor light adjustment section and a low reflective membrane is provided on the end surface.

5. The semiconductor laser device according to claim 1, wherein said semiconductor light adjustment section has a layered structure forming a semiconductor light amplifier that amplifies an output of laser light generated by said semiconductor laser diode section.

6. The semiconductor laser device according to claim 5, wherein said semiconductor light amplifier has a layered structure that is formed so as to share at least an active layer of said semiconductor laser diode section.

7. The semiconductor laser device according to claim 1, wherein said semiconductor light adjustment section has a layered structure forming a semiconductor light attenuator that attenuates an output of laser light generated by said semiconductor laser diode section.

8. The semiconductor laser device according to claim 7, wherein said semiconductor light attenuator is provided with superposed high resistance layers at a separation groove formed above a boundary of a joint between said semiconductor laser diode section and said semiconductor light adjustment section.

9. A semiconductor laser module, comprising:
   a semiconductor laser device, provided with
      a semiconductor substrate,
      a semiconductor laser diode section disposed on a first portion of said semiconductor substrate, said semiconductor laser diode section having
         a reflective end surface,
         an emission end surface, and
         an active layer configured to produce laser light that propagates between said reflective end surface and said emission end surface;
      a diffraction grating formed adjacent to said active layer and between said reflective end surface and said emission end surface, wherein said diffraction grating and said active layer cooperate to produce said laser light formed configured to a plurality of oscillation vertical modes that are below a predetermined output value, consistent with wavelength selection properties of the diffraction grating, and
      a semiconductor light adjustment section that is integrated on a second portion of the semiconductor substrate and configured to adjust an output of the laser light;
   an optical fiber which guides laser light emitted from said semiconductor laser device to outside the semiconductor laser device; and
   an optical coupling lens system which optically couples said semiconductor laser device with the optical fiber.

10. A semiconductor laser control method which controls an output of laser light from a semiconductor laser device provided with a semiconductor laser diode section that generates laser light having a plurality of oscillation vertical modes that are below a predetermined output value using wavelength selection properties of a diffraction grating formed adjacent to an active layer and between a reflective end surface and an emission end surface of laser light, and a semiconductor light adjustment section that is integrated on the same semiconductor substrate on which the semiconductor laser diode section is formed, and that adjusts an output of the laser light, comprising:
   a step of fixing a current applied to said semiconductor laser diode section; and
   a step of adjusting a current or voltage applied to said semiconductor light adjustment section.

* * * * *